United States Patent [19]

Taniguchi et al.

[11] 3,760,200

[45] Sept. 18, 1973

[54] SEMICONDUCTOR INTEGRATED CIRCUIT

[75] Inventors: Kenji Taniguchi, Kodaira; Akio Hayasaka, Kokubunji; Akira Masaki; Tsuneyo Chiba, both of Kodaira; Tadao Kaji, Kokubunji, all of Japan

[73] Assignee: Hitachi, Ltd., Tokyo, Japan

[22] Filed: Feb. 24, 1972

[21] Appl. No.: 229,147

[30] Foreign Application Priority Data

Feb. 24, 1971 Japan .............................46/8645

[52] U.S. Cl. .................. 307/303, 307/213, 307/310

[51] Int. Cl. ............................................ H03k 19/08

[58] Field of Search ...................... 307/303, 310, 213

[56] References Cited

UNITED STATES PATENTS 3,617,778 11/1971 Korom ............................... 307/303

*Primary Examiner*—John Zazworsky

*Attorney*—Paul M. Craig, Jr. et al.

[57] ABSTRACT

A semiconductor integrated circuit is formed on a semiconductor substrate and includes a current mode type logic circuit and a constant current circuit to supply a constant current to the logic circuit. A reference resistor for adjusting the constant current is provided separately from the semiconductor substrate and connected to the constant current circuit. With this construction, fluctuations of the amplitude of the logic circuit output signal may be reduced.

7 Claims, 12 Drawing Figures

SEMICONDUCTOR INTEGRATED CIRCUIT

BACKGROUND OF THE INVENTION

This invention relates to semiconductor integrated circuits, and more particularly, to improvements in current mode type semiconductor integrated logic circuits used in digital computers and the like.

DESCRIPTION OF THE PRIOR ART

Current mode type logic circuits have heretofore been used as the highest speed logic circuit in digital computers and the like. One of the most important problems encountered when integrating such logic circuits is how to reduce fluctuations in the output signal amplitude. If emitter resistors and collector load resistors of a logic circuit are integrated in the same semiconductor, it is possible to obtain an output voltage with high precision. However, if the collector load resistors are provided separately from the integrated circuit, it is not possible to obtain the output voltage with high precision, and wide fluctuations in the output are inevitable.

In large size computer systems, numerous circuit elements are employed, so that their mounting structure requires a considerably large amount of space. By way of example, in such a system, the output of one logic circuit often has to be transmitted over a transmission line as long as several tens of centimeters to several meters.

As is well known in the art, to reduce reflections in the transmission line, it is effective to provide a distributed constant line having comparatively uniform characteristic impedance for the transmission line and terminate the reception end of the line with a resistance substantially equal to the aforementioned characteristic impedance.

In this case, however, the transmission line and terminal resistor are provided externally of the integrated circuit, so that the output voltage is subjected to wide fluctuations. Therefore, even if the afore-mentioned logic circuit is integrated, the integrated circuit can never be expected to be practically employed in digital computers.

An object of the invention is to provide a semiconductor integrated logic circuit, in which the fluctuation of the output signal amplitude can be made very small, even if collector load resistors are externally provided.

Another object of the invention is to provide a semiconductor integrated logic circuit which is capable of driving an external transmission line.

A further object of the invention is to provide a semiconductor integrated logic circuit which enables driving long transmission lines in digital computers and the like without any provision of various conversion circuits.

In accordance with the invention, the above various objects are achieved by integrating one or more current mode type logic circuits on a semiconductor substrate together with a constant current circuit connected to the logic circuit or circuits and providing an outer reference current source or reference resistor external to the integrated circuit for specifying the output current of the constant current circuit, thereby enabling the output of the logic circuit or circuits to be coupled to an outer impedance such as transmission line.

Figures 1A, 1B:
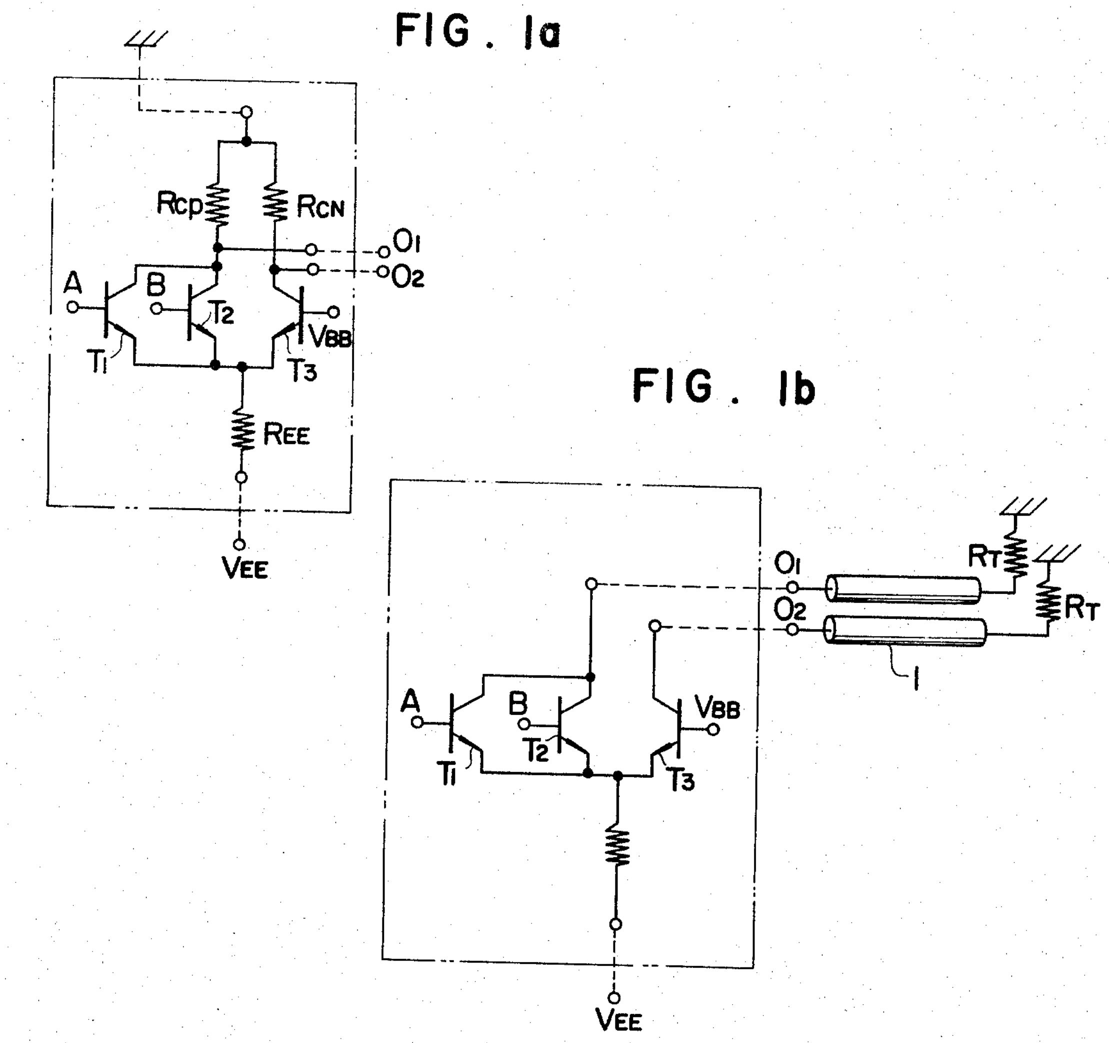
FIGS. 1*a* and 1*b* show an example of a prior-art current mode type logic circuit.

DESCRIPTION OF THE PREFERRED EMBODIMENTS:

FIGS. 1*a* and 1*b* illustrate an example of the prior-art current mode type logic circuit. The illustrated circuit includes input transistors $T_1$ and $T_2$ which have their emitters and collectors commonly connected and their bases connected to respective input terminals A and B, and a third transistor $T_3$ to the base of which a reference voltage $V_{BB}$ is applied. In accordance with the relative amplitude of the input voltages impressed upon the input terminals A and B relative to the reference voltage $V_{BB}$, NOR and OR outputs may be obtained at respective output terminals $O_1$ and $O_2$.

In this logic circuit, the amplitudes of the respective outputs are determined by the reference voltage $V_{BB}$ and respective resistance ratios $R_{CP}/R_{EE}$ and $R_{CN}/R_{EE}$ of collector load resistances $R_{CP}$ and $R_{CN}$ to emitter load resistance $R_{EE}$ for the input transistors. Accordingly, in integrating this logic circuit by forming the collector load resistors $R_{CP}$ and $R_{CN}$ and emitter load resistor $R_{EE}$ in the same semiconductor substrate ( indicated as a dashed rectangle ) a comparatively superior precision, for instance about $\pm 3\%$, may be obtained for the aforementioned resistance ratios, so that fluctuations of the output signal amplitude, mentioned earlier, may be reduced.

However, if it is intended to drive a transmission line 1 which is external to the integrated circuit in place of the afore-mentioned collector load resistance, it is difficult to obtain a high precision for the resistance ratio between terminal resistance $R_T$ which corresponds to the afore-mentioned collector resistance and the emitter load resistance, so that the signal amplitude will fluctuate to a great extent up to about $\pm 20\%$.

Figure 2:
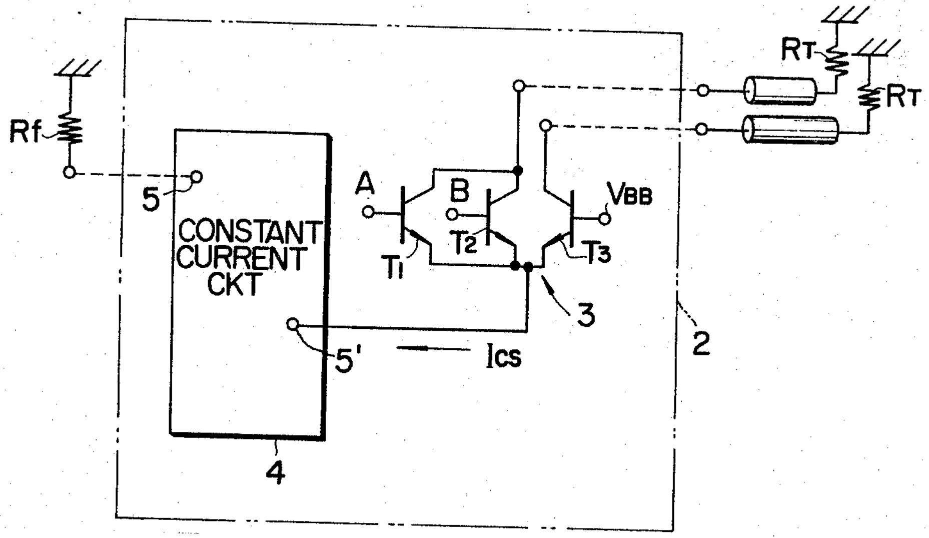
FIG. 2 is a schematic of the basic circuit according to the invention.

In accordance with the invention, the aforementioned logic circuit, which is generally designated at 3 in FIG. 2, is integrated on a semiconductor substrate 2 together with a constant current circuit 4 connected to the common emitter terminal of the logic circuit, and a reference resistor $R_f$ for determining the output current $I_{CS}$ is provided separately from the integrated circuit. With this arrangement, the current $I_{CS}$ which is determined by the reference resistor $R_f$ external to the integrated circuit is supplied to the logic circuit 2 and the fluctuation of the resistance ratio or current ratio within the integrated circuit can be reduced. Thus, the dependance of the collector output current from the logic circuit 2 upon the resistors within the integrated circuit can be reduced. In this manner, fluctuations in the amplitude of the signal $V_S$ appearing across the terminal resistor $R_T$ when the external transmission line 1 is driven can be extremely reduced.

Figure 3:
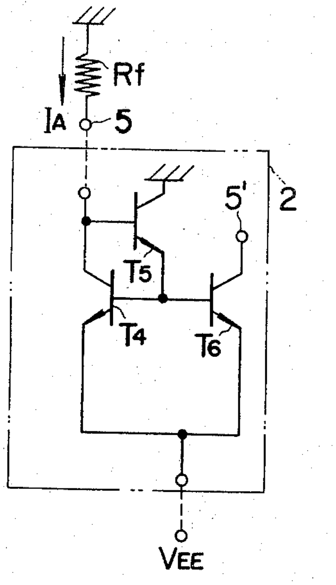
FIG. 3 to FIG. 6 are circuit diagrams of examples of the constant current circuit used in accordance with the invention.

FIG. 3 shows an example of the constant current circuit. Referring to the figure, if transistors $T_4$, $T_5$ and $T_6$ have an equal current amplification factor $h_{FE}$, the relation between driving current $I_A$ flowing from terminal 5 and collector current $I_{CS}$ in the transistor $T_6$ can be expressed as $$I_{CS} = fh_{FE}2/(1 + r + h_{FE}2)\ I_A \ldots \qquad (1)$$

where $r$ is the emitter area ratio between the transistors $T_4$ and $T_6$.

In equation (1) the value of $h_{FE}2$ is very large compared to the value of ( $1 + r$ ) so that the latter can be ignored. Then, $$I_{CS} = rI_A$$

which signifies that if the driving current $I_A$ is constant, the collector current $I_{CS}$ ( output current ) can be made constant.

When the above constant current circuit is used as a driving power source for the logic circuit 2 as mentioned earlier, the driving current $I_A$ is determined by the source voltage $V_{EE}$, forward voltage $V_{BE}$ across the base-to-emitter path of the transistors $T_4$ to $T_6$ and the resistance of the reference resistor $R_f$. Meanwhile, the collector current $I_{CS}$ in the transistor $T_6$ is substantially proportional to the driving current $I_A$, as mentioned earlier. Thus, it will be apparent that by suitably selecting the source voltage $V_{EE}$ and the resistance of the reference resistor $R_f$, a given constant current may be supplied to the logic circuit.

Figure 4:
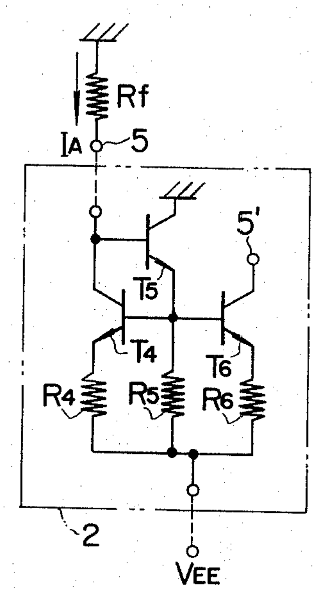

FIG. 4 shows another constant current circuit, which includes resistors $R_4$ and $R_6$ in series with the respective emitters of the transistors $T_4$ and $T_6$ and serving to determine the current ratio. If the resistance ratio $R_4/R_6$ is made equal to the afore-mentioned emitter area ratio $r$ between the transistors $T_4$ and $T_6$, the current ratio $I_{CS}/I_A$ can be made to be still closer to $r$. If $R_4/R_6$ is not equal to $r$, the current ratio $I_{CS}/I_A$ will usually not approximate but will rather be determined by $R_4/R_6$.

Figure 11:
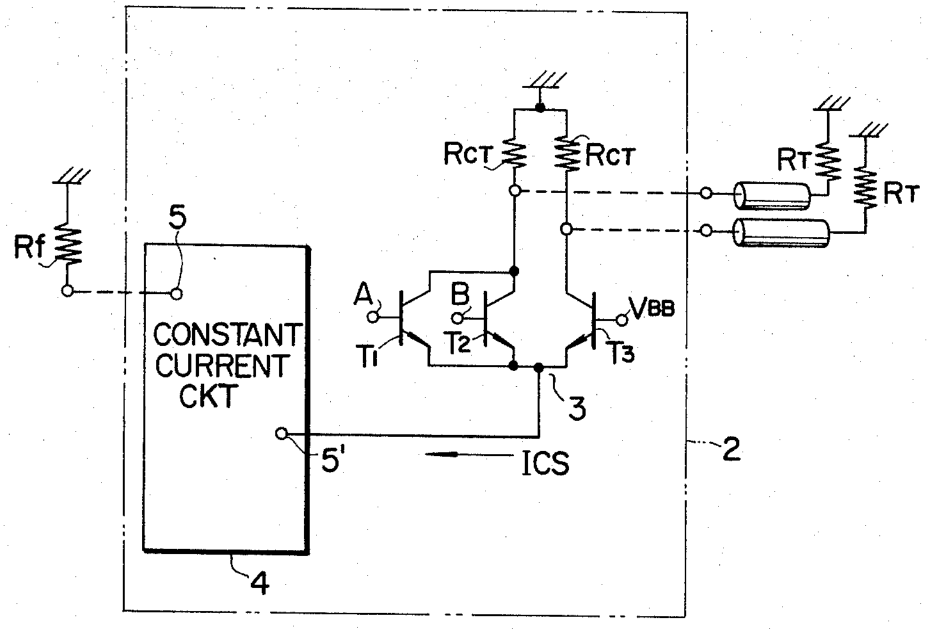

If the resistance $R_4$ is sufficiently small, compared with the reference resistance $R_f$, the current is substantially determined solely by $R_f$, while with $R_4$ set to be equal to or nearly equal to $R_f$ the current $I_A$ is determined by both the resistances $R_f$ and $R_4$. The latter arrangement is effective in a case as shown in FIG. 11 where part of the collector load of the logic circuit is constituted by resistor $R_{CT}$ within the integrated circuit and the rest of the load is constituted by resistor $R_T$ external to the integrated circuit. In this case the resistance $R_4$ within the integrated circuit and resistance $R_{CT}$ provide a certain correlation and will vary always in the same direction, thus assisting the reduction of the fluctuation of the signal amplitude of the logic circuit output.

Figure 5:
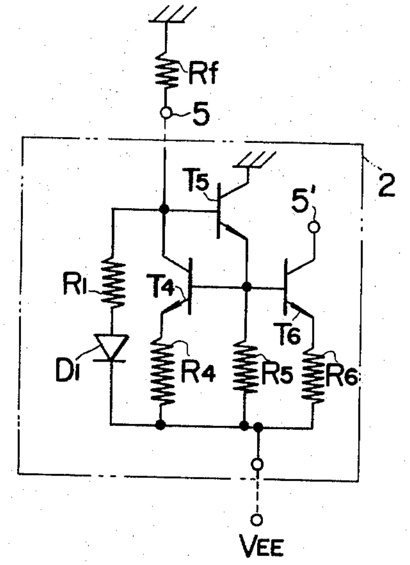

In the circuit of FIG. 5, where a series circuit of resistor $R_1$ and diode $D_1$ is connected in parallel with transistor $T_4$, the variation in the collector current in the transistor $T_4$ can be compensated to some extent by the variation of the driving current $I_A$ due to fluctuation of the afore-mentioned base-emitter forward voltage $V_{BE}$ and temperature variations.

Figure 6:
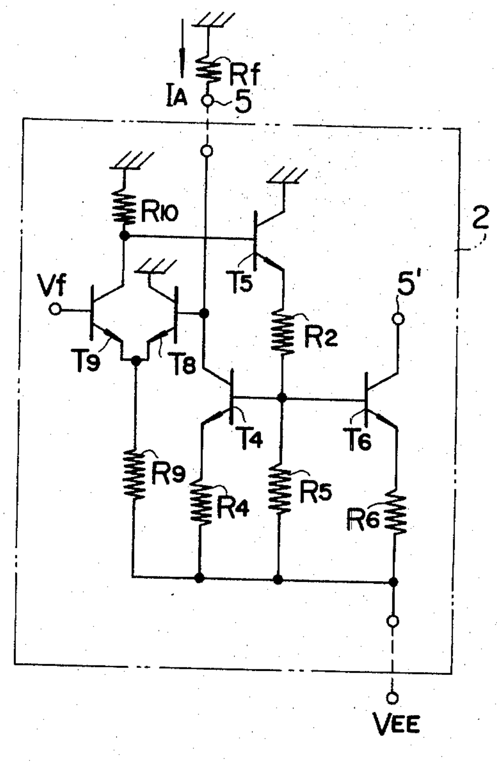

FIG. 6 shows still another constant current circuit. In this circuit, the collector potential on the transistor $T_4$ is compared with the reference voltage $V_f$ by a differential amplifier constituted by transistors $T_8$ and $T_9$ and resistors $R_9$ and $R_{10}$, and the result is amplified and supplied to the common base terminal of the transistors $T_4$ and $T_6$ through an emitter follower circuit consisting of transistor $T_5$ and resistors $R_2$ and $R_5$.

With this construction, with a decrease in the current $I_A$ flowing through the resistor $R_f$, for instance, the collector potential of the transistor $T_4$ is increased to increase the base potential of the transistor $T_5$, thus eventually increasing collector current in the transistor $T_4$ and hence the current $I_A$. Thus, the driving current $I_A$ can be specified by the reference resistance $R_f$ and reference voltage $V_f$. Again in this case, if the transistors $T_4$ and $T_6$ have an equal emitter area and the resistors $R_4$ and $R_6$ have an equal resistance, the collector currents in the transistors $T_4$ and $T_6$ may be maintained to be the same.

It will be noted that the reference resistor $R_5$ in the preceding constant current circuits may be replaced with a reference current source independent of the integrated circuit.

Figure 7:
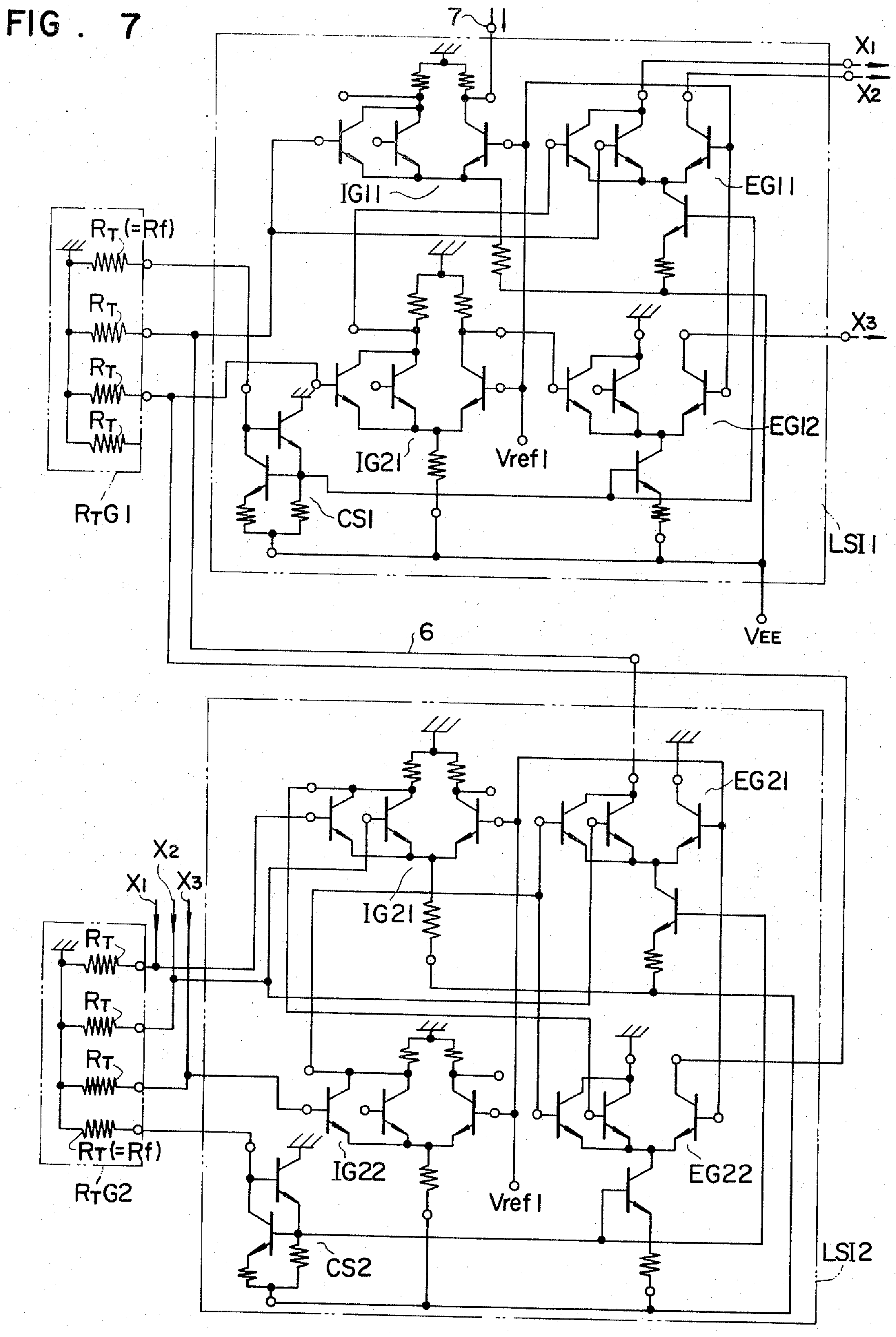
FIGS. 7 to 11 are schematics showing preferred embodiments of the invention.

FIG. 7 shows one embodiment of the invention. $LSI_1$ and $LSI_2$ designate semiconductor substrates in which a plurality of current mode type logic circuits are integrated. Logic circuits $IG_{11}$ to $IG_{22}$ drive transmission line 7 as an external load which is comparatively short so that no reflection problem is encountered. Accordingly, they are not constructed to be supplied with any constant current as mentioned above.

On the other hand, the outputs $X_1$, $X_2$ and $X_3$ of logic circuits $EG_{11}$ and $EG_{12}$ are coupled through a comparatively long external transmission line ( not shown ) to associated logic circuits in $LSI_2$. Similarly, the outputs of logic circuits $EG_{21}$ and $EG_{22}$ are coupled through a transmission line 6 to associated logic circuits in $LSI_1$. Terminal resistors $R_T$ of the transmission lines are grouped on printed circuit plates $R_{TG1}$ and $R_{TG2}$. The resistor groups each include a surplus resistor used as reference resistor $R_f$ for a corresponding one of the constant current circuits $CS_1$ and $CS_2$. The logic circuits $EG_{11}$ to $EG_{22}$ are constructed to be supplied with a constant current from the constant current circuits $CS_1$ to $CS_2$ since they each drive a comparatively long transmission line, as mentioned above.

Figure 8:
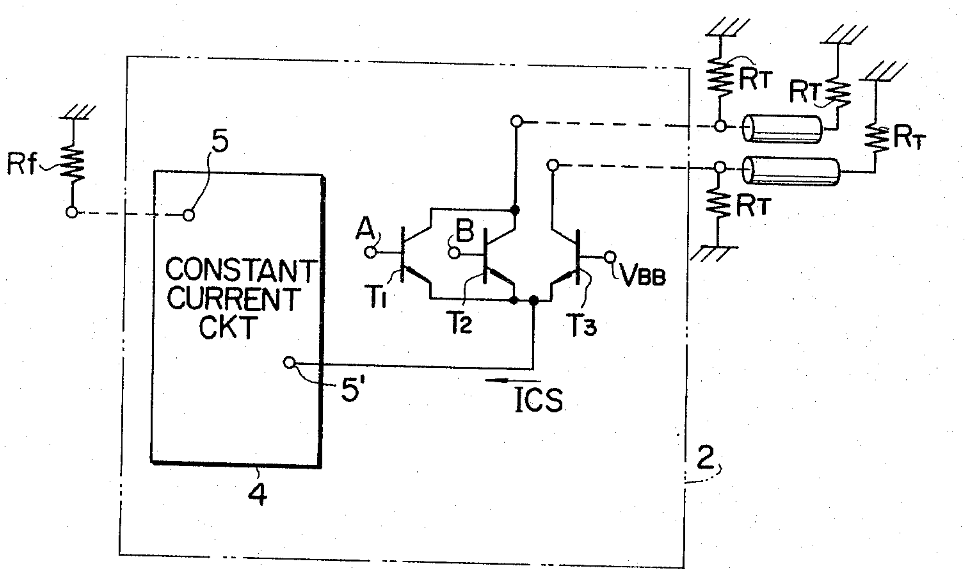

If opposite ends of the transmission lines terminate in respective resistors $R_T$ as shown in FIG. 8, the output current $I_{CS}$ of the constant current circuit may be set to be double that in the case of a single end termination of a transmission line with resistance.

Figure 9:
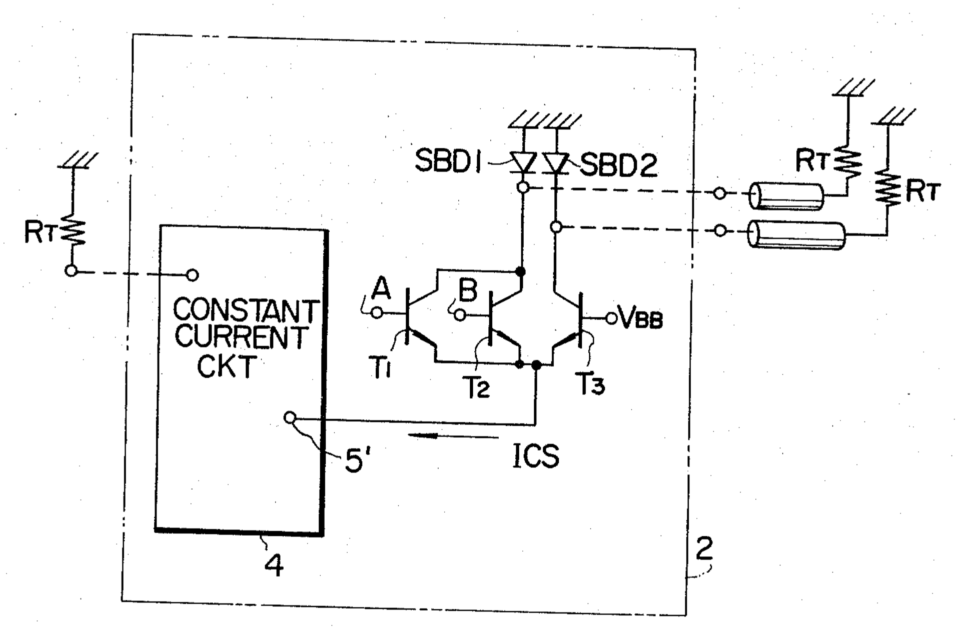

In the FIG. 9, embodiment, Schottky barrier diodes $SBD_1$ and $SBD_2$ are provided for clamping low level portions of the output signal. With this construction according to the invention, there is no need of causing the flow of extra gate current to ensure that clamping always takes place at a given low level, so that the power consumption may be reduced.

Figure 10:
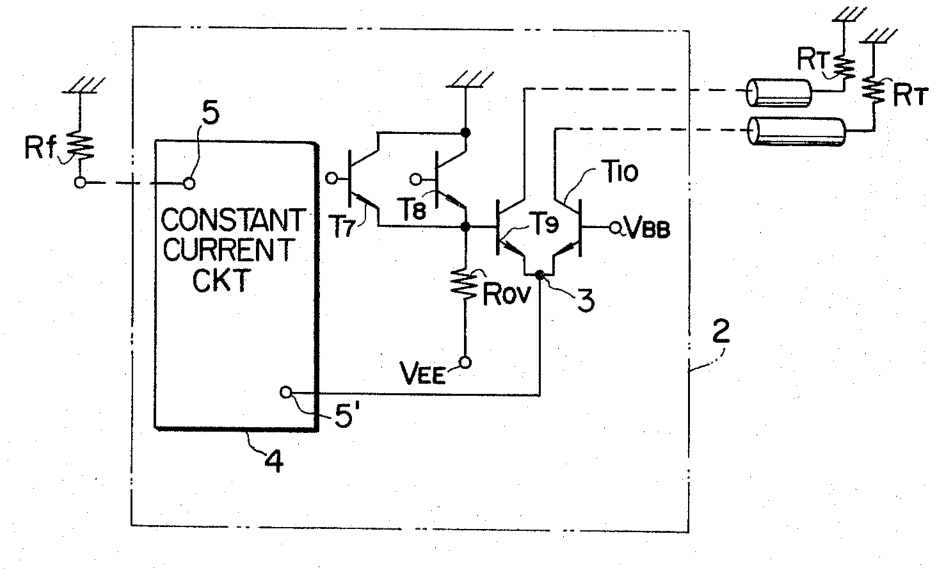

While the foregoing description of the invention has concerned with on-line current mode type semiconductor integrated logic circuits, similar effects as described above may also be obtained when the invention is applied to a so-called emitter-to-emitter coupling integrated logic circuit as shown in FIG. 10.

It is to be noted that any well known method may be employed to realize an integrated circuit according to the invention.

As has been described in the foregoing, according to the invention it is possible to drive transmission line which has been practically impossible with the usual collector drive type integrated circuit. Also, no particular conversion circuitry is required for the driving of transmission lines. Further, the transmission output from one integrated logic circuit may be directly coupled to another, so that any conversion circuit in the path from transmission line to the inside of integrated logic circuit is not needed, which is extremely beneficial in practice.

We claim:

1. A semiconductor integrated circuit device comprising:

a semiconductor substrate on which an integrated circuit is formed, said integrated circuit including at least one current mode type logic circuit and a constant current circuit connected to said logic circuit for supplying a constant current thereto; and reference means disposed at the outside of said semiconductor substrate and connected to said constant current circuit for determining said constant current, said logic circuit comprising at least one reference transistor having a base electrode to which a reference signal is applied, and at least one input transistor having a base electrode to which an input signal is applied, the emitter electrodes of said input and reference transistors being connected to said constant current circuit and the collector electrodes of said transistors being adapted to produce at least one logic signal in response to said input signal, said constant current circuit including a grounded collector type first transistor having a base electrode connected to said reference means, a second transistor having its collector electrode connected to the base electrode of said first transistor, and a third transistor having its collector electrode connected to said logic circuit, the base electrodes of said second and third transistors and the emitter electrodes of said second and third transistors being connected to a terminal for receiving a power source voltage.

2. A semiconductor integrated circuit device according to claim 1, which further comprises a series circuit composed of a resistor and a diode connected between the collector electrode of said second transistor and said power source terminal.

3. A semiconductor integrated circuit device according to claim 1, which further comprises a differential amplifier circuit connected between said reference means and the base electrode of said first transistor.

4. A semiconductor integrated circuit device according to claim 1, which further comprises emitter resistors for connecting the emitter electrodes of said second and third transistors to said power source terminal and a common-base resistor for connecting the bases of said second and third transistors to said power source terminal.

5. A semiconductor integrated circuit device according to claim 4, which further comprises a series circuit composed of a resistor and a diode connected between the collector electrode of said second transistor and said power source terminal.

6. A semiconductor integrated circuit device according to claim 3, which further comprises emitter resistors for connecting the emitter electrodes of said second and third transistors to said power source terminal and a common-base resistor for connecting the base of said second and third transistors to said power source terminal.

7. A semiconductor integrated circuit device according to claim 1, which further comprises a pair of Schottky barrier diodes connected between the respective collectors of the transistors of said logic circuit and a source of reference potential.

* * * * *